United States Patent
Tomar et al.

(10) Patent No.: US 7,415,681 B2
(45) Date of Patent: Aug. 19, 2008

(54) OPTIMAL MAPPING OF LUT BASED FPGA

(75) Inventors: Ajay Tomar, Ghaziabad (IN);
Dhabalendu Samanta, Delhi (IN)

(73) Assignee: Sicronic Remote KG, LLC,
Wilmington, DE (US)

( * ) Notice: Subject to any disclaimer, the term of this patent is extended or adjusted under 35 U.S.C. 154(b) by 20 days.

(21) Appl. No.: 11/025,785

(22) Filed: Dec. 29, 2004

(65) Prior Publication Data

US 2005/0156626 A1    Jul. 21, 2005

(30) Foreign Application Priority Data

Dec. 29, 2003    (IN)    ............ 1639/DEL/2003

(51) Int. Cl.
*G06F 17/50* (2006.01)
*G06F 9/45* (2006.01)
*H03K 17/693* (2006.01)

(52) U.S. Cl. ............... 716/2; 716/5; 716/16

(58) Field of Classification Search .......... 716/16–17, 716/2, 5
See application file for complete search history.

(56) References Cited

U.S. PATENT DOCUMENTS 6,336,208 B1    1/2002    Mohan et al.
2004/0133869 A1*  7/2004   Sharma ............ 716/16

OTHER PUBLICATIONS

Bhardwaj, Sarvesh; Timing Analysis Under Uncertainty; 2003; Proceedings of the International Conference on Computer Aided Design; pp. 615-620.*

Sung Kyu Lim, et al., "Partitioning and Placement for Buildable QCA Circuits," ACM Journal on Emerging Technologies in Computing Systems, vol. 1, No. 1, Apr. 2005, pp. 50-72.

Francis, et al., "Chortle: A Technology Mapping Program for Lookup Table-Bsed Field Programmable Gate Arrays," Proceedings, 27th ACM/IEEE Design Automation Conference, pp. 613-619, Jun. 1990.

Farrahi, et al., "Complexity of the Lookup-Table Minimization Problem for FPGA Technology Mapping," Proceedings, 27th ACM/IEEE Design Automation Conference, pp. 1319-1332, Jun. 1990.

Cong, et al., "On Area/Depth Trade-off in LUT-Based FPGA Technology Mapping," 30th ACM/IEEE Design & Automation Conference (DAC), pp. 213-218, 1993.

K.-C. Chen, et al., "DAG-Map: Graph-Based FPGA Technology Mapping for Delay Optimization," IEEE Design & Test of Computers, pp. 7-20, Sep. 1992.

Francis, et al., "Technology Mapping of Lookup Table-Based FPGAs for Performance," IEEE/ACM International Conference on Computer-Aided Design (ICCAD), pp. 568-571, Nov. 1991.

* cited by examiner

*Primary Examiner*—Paul Dinh
*Assistant Examiner*—Suresh Memula

(57) ABSTRACT

A method and system for improved optimal mapping of LUT based FPGA's. The invention comprises performing a topological sort on the network to be mapped, whereby the network is represented in form of a Directed Acyclic Graph. The system locates feasible reconvergent paths existing from transitive fan-ins of each node using a Reconvergent Path Locator for replicating fan-outs of the nodes in the DAG, and therefore optimizing the number of LUT's and the time consumed in the mapping process.

25 Claims, 3 Drawing Sheets

OPTIMAL MAPPING OF LUT BASED FPGA

PRIORITY CLAIM

The present application claims priority from Indian Patent Application No. 1639/Del/2003 filed Dec. 29, 2003 as a provisional application, and for which a complete application was filed on Dec. 9, 2004, the disclosures of which are hereby incorporated by reference.

BACKGROUND OF THE INVENTION

1. Technical Field of the Invention

The present invention refers to an improved optimal mapping of LUT based FPGA. In particular the invention relates to a system that optimizes the design area in FPGA by exploring reconvergent paths in conjunction with Fan out replication in LUT mapping.

2. Description of Related Art

A programmable logic array device has a plurality of logic elements and an interconnect structure for conveying signals between logic elements. In LUT (Look Up Table) based FPGA's (Field Programmable Gate Arrays), mapping is done prior to the placement and routing of the design in FPGA. The objective of LUT mapping is to reduce the area/depth of the mapped solution.

In LUT based FPGA's, optimal mapping of gates into LUT's is done while ensuring that the number of transitive fan-ins to sink is always less than or equal to the number of LUT inputs. FIG. 1 illustrates the mapping process as a part of the FPGA development flow. 1.1 in the figure indicates the Gate Level Netlist as an input to the Optimizer Block that outputs Optimized Gate Level Netlist 1.2. The optimized netlist is then Mapped into LUT as shown in the 1.3 that is followed by Packing LUT's in to Programmable Logic Blocks (PLB's) 1.4. Then the design is simulated for Placement and Routing 1.5, 1.6. The bit stream is generated as in the Configuration Bits of the Design block 1.7. The bit stream is then downloaded in the FPGA to configure the FPGA as shown in the block 1.8. FIG. 2 illustrates a prior art Mapping process in LUT based FPGA's. 2.1 is Directed Acyclic Graph (DAG) that represents the mapping data as nodes, wherein the nodes in the DAG simulate the LUT's in the FPGA. 2.1 also illustrates initialization of the inputs to the LUT's (k) and the initialization of the fan-out factor. Block 2.2 illustrates performing a topological sort on the DAG. Block 2.3 illustrates the Computation of the Dependency variable for each node in the graph, whereby the dependency is computed keeping in view that the nodes are analyzed for their respective inputs and outputs. Block 2.4 performs check on the Dependency Variable till it is greater than the variable k. Block 2.5 shows the computation of the Priority Variable (Fc) for all the children of the node under consideration, and performing the same function for all other nodes in the Directed Acyclic Graph. Priority Variable (Fc) is a function of the following:

Contribution Variable (Zc), where c in the suffix denotes the children of the node.
Number of fan-outs (Oc) for the children of the node under consideration.
Fan-out Factor (FF) variable.

Block 2.6 sorts the list of the children of the node under consideration in the descending order of their priority values followed by block 2.7 that assigns LUT's to the children of the node under consideration until the dependency variable is less than k plus one.

Block 2.8 assigns a LUT to each output of a given node that have been left unassigned.

The computations for the Contribution Variable, Dependency variable, and the Priority Function is as shown below:

Let a given design be represented by a directed acyclic graph (DAG) G(V, E) where each vertex v in V represents a Boolean function and each directed edge (v, u) represents a connection between the output of v and the input of u.
Let VI denotes the set of nodes for which LUT is assigned.
That is, VI={v∈V: a LUT is assigned to v}.
Contribution Zv:
For each PI v, Zv=1,
For each v∈VI, Zv=1,
For all the other vertices v∈V, $Z_v = Z_{u1} + Z_{u2} + \ldots + Z_1$
where u1, u2, . . . , ul are all the children of v.
Dependency dv:
a) For each PI v, dv=1
b) For all other vertices v∈V, $dv = Z_{u1} + Z_{u2} + \ldots + Z_1$ where u1, u2, . . . , ul are all the children of v.
Priority Function Fv:

$$Fv = F(Zv, Ov, FF) = Zv + FF * Ov$$

Where Ov is the number fan outs of v and FF is a suitable fan out factor.

The prior art Level Map method does not take into account of reconvergent paths and fan-out replication effectively, therefore it is essential to provide a system for optimizing design area in FPGA by exploring reconvergent paths in conjunction with fan-out replication in LUT mapping.

SUMMARY OF THE INVENTION

The object of the invention is to obviate the shortcomings of the prior art and provide a method for optimizing mapping in FPGA by exploring reconvergent paths in conjunction with fan-out replication in LUTs.

Another object of the invention is to optimize the time taken in execution of the mapping Process.

Yet another object of the present invention is to reduce the number of LUT's used in the mapping process.

To achieve said objectives present invention provides a system for improved optimal mapping of LUT based FPGAs comprising:

a Directed Acyclic Graph (DAG) representation of the network to be mapped,
a sorter that operates on said DAG to reduce its complexity,
a Dependency Definer that determines the dependency of each node in the DAG,
a Reconvergent Path Locator (RPL) that determines feasible reconvergent paths from transitive fan-ins of each said node,
a Priority Determiner (PD) that determines the priority of all the child nodes of each said node,
a Node Sorter (NS) that sorts the list of child nodes in descending order of priority,
a Mapper (M) that assigns LUT's to the child nodes from the beginning of said sorted list until the node dependency is less than one plus the number of LUTs,
an Assignor (A) that assigns an LUT to each output of a particular node.

The said sorter is a topological sorter.
The said Node Sorter is a Child node sorter.
The said Mapper is a LUT Mapper.
The said Assignor is a LUT assignor.

The invention also provides a method for improving optimal mapping of LUT based FPGA's, the method comprising the steps of:

generating a Directed Acyclic Graph (DAG) representation of the network to be mapped, sorting the network in the DAG to reduce the complexity of the network, determining dependency of each node in the DAG, locating feasible reconvergent paths existing from transitive fan-ins of each node, determining the priority of all the child nodes of each node, sorting the child nodes in the descending order of their priority, assigning LUTs to the child nodes until the node dependency is less than one plus the number of LUTs, and assigning an LUT to each output of the nodes in the DAG representation.

The said sorting is topologically sorting the network in the DAG.

The said dependency is determined by considering the inputs and outputs of each node.

The said feasible reconvergent paths are selected to be equal to said number of inputs to one LUT.

The said determining the priority is generating the priority for the child nodes based on the fan-outs of the nodes in said DAG.

The said assigning an LUT is forming LUT for a node after performing a check on the number of fan-outs for said node and dependency of the node.

The said forming LUT is assigning LUTs to all unassigned nodes.

The present invention further provides a computer program product comprising computer readable program code stored on a computer readable storage medium embodied therein for providing a system for optimal mapping of LUT based FPGA's, the system comprising:

a Directed Acyclic Graph (DAG) representation of the network to be mapped, a sorter that operates on said DAG to reduce its complexity, a Dependency Definer that determines the dependency of each node in the DAG, a Reconvergent Path Locator (RPL) that determines feasible reconvergent paths from transitive fan-ins of each said node, a Priority Determiner (PD) that determines the priority of all the child nodes of each said node, a Node Sorter (NS) that sorts the list of child nodes in descending order of priority, a Mapper (M) that assigns LUT's to the child nodes from the beginning of said sorted list until the node dependency is less than one plus the number of LUTs, an Assignor (A) that assigns an LUT to each output of a particular node.

The said sorter is a topological sorter.

The said Node Sorter is a Child node sorter.

The said Mapper is a LUT Mapper.

The assignor is a LUT assignor.

The present invention thereby optimizes mapping for LUT based FPGA's and reduces the design area, with optimized mapping speed.

BRIEF DESCRIPTION OF THE DRAWINGS

The invention will now be described with reference to the accompanying drawings.

DETAILED DESCRIPTION OF THE DRAWINGS

Figure 1:
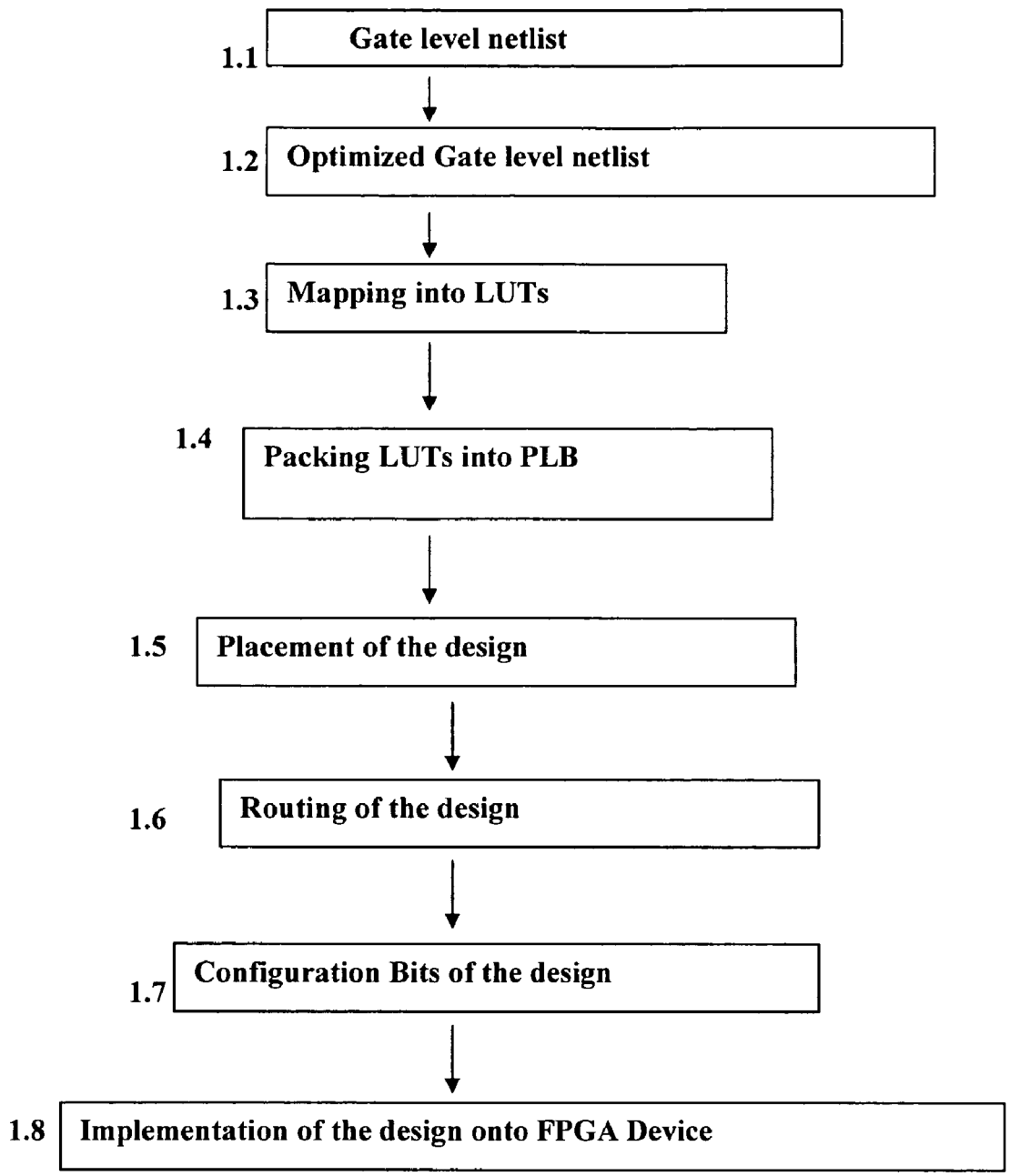
FIG. 1 illustrates the FPGA development flow and the process of mapping in it.
Figure 2:
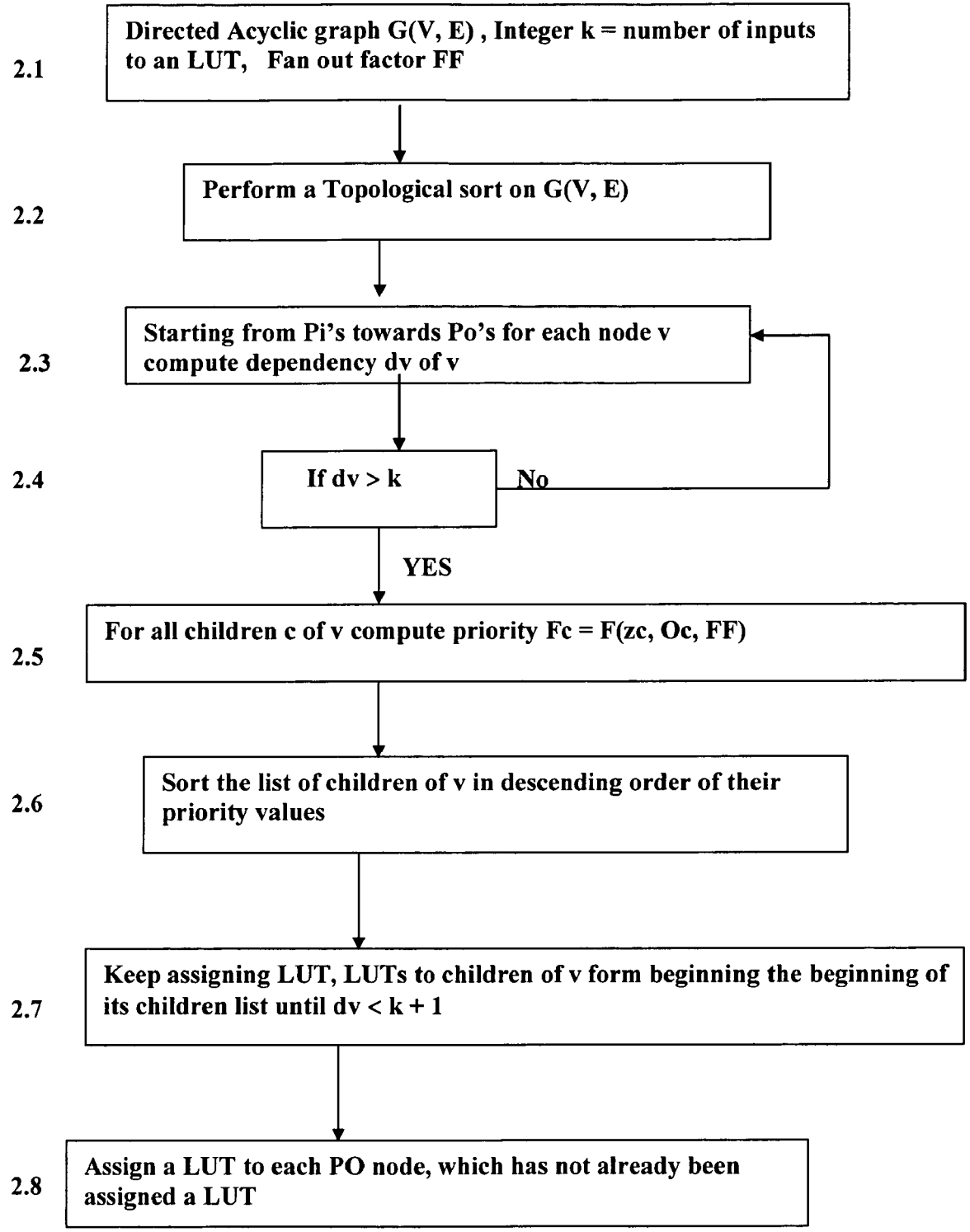
FIG. 2 illustrates the flow diagram of a prior art mapping process.

FIG. 1 and FIG. 2 depicting the FPGA development flow and Prior art mapping process respectively have been described under the heading 'Background of the Invention'.

Figure 3:
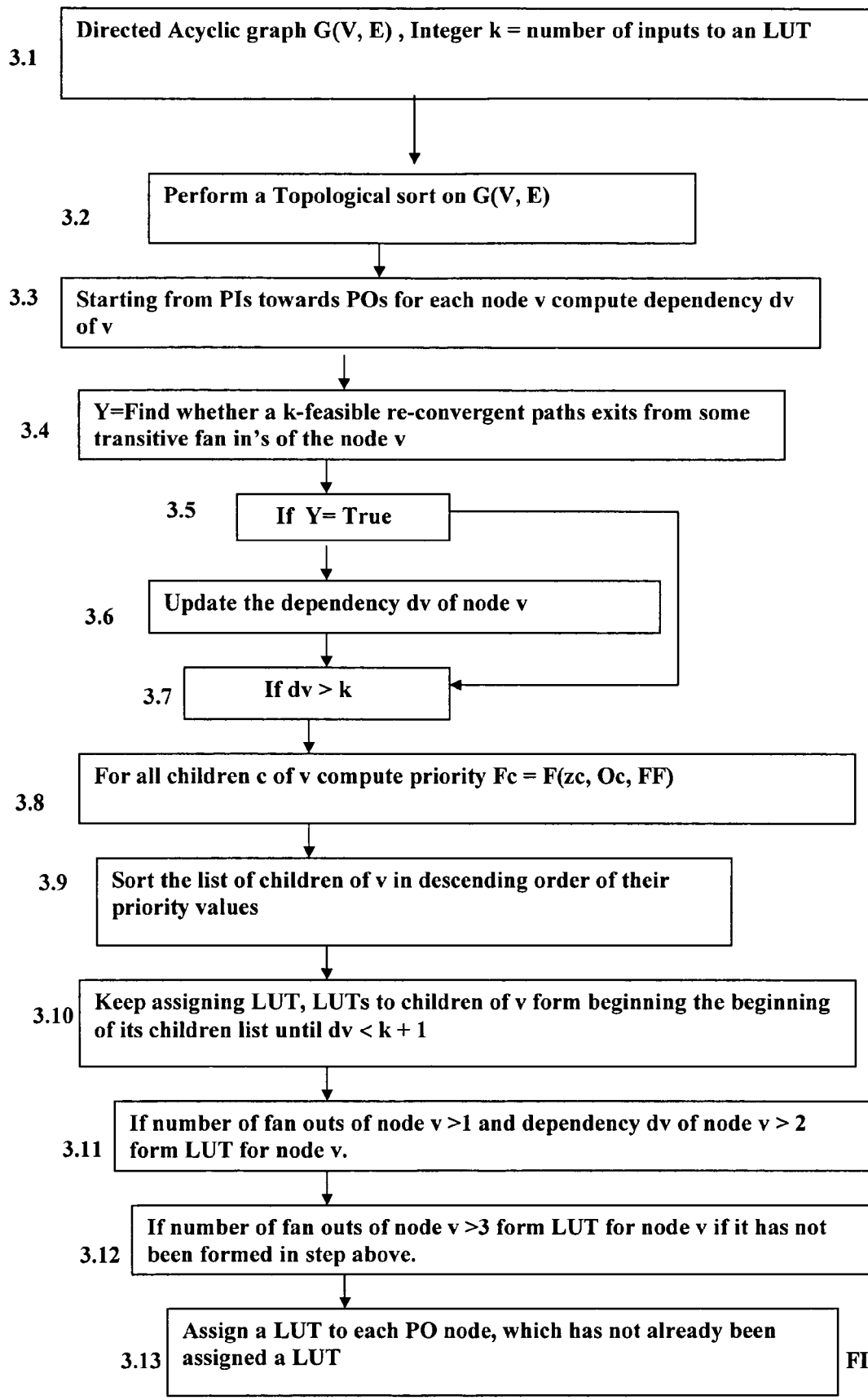
FIG. 3 illustrates the flow diagram of the system for present invention.

FIG. 3 shows the flow diagram of the present invention that incorporates exploration of the reconvergent paths in conjunction with fan-out replication. Block 3.1 initiates the Directed Acyclic Graph (DAG) representation of the data to be mapped and the number of inputs to the LUT is initialized (k). Block 3.2 illustrates performing topological sort on the given DAG. Block 3.3 illustrates the Computation of the Dependency variable (dv) for each node (v) in the graph, whereby the dependency is computed keeping in view that the nodes are analyzed for their respective inputs and outputs. Block 3.4 searches for feasible reconvergent paths from transitive fan-ins of a particular node under consideration. The reconvergent paths are desirable to be equal to k. The Dependency of the node under consideration is updated till the dependency variable is greater than k in Blocks 3.5, 3.6 & 3.7. Block 3.8 shows the computation of the Priority Variable (Fc) for all the children of the node under consideration, and performing the same function for all other nodes in the Directed Acyclic Graph. Priority Variable (Fc) is a function of the following:

Contribution Variable (Zc), where c in the suffix denotes the children of the node.

Number of fan-outs (Oc) for the children of the node under consideration.

Fan-out Factor (FF) variable.

Block 3.9 sorts the list of the children of the node under consideration in the descending order of their priority values followed by block 3.10 that assigns LUT's to the children of the node under consideration until the dependency variable is less than k plus one. Block 3.11 checks whether the number of fan-outs of node is greater than one and the Dependency variable dv of the node is greater than 2, then form a LUT for the given node under consideration followed by formation of LUT if the number of fan-outs is greater than three as in Block 3.12. Here LUT is formed, if it has not been formed in the Block 3.11. Block 3.13 assigns a LUT to each output of a given node that has been left unassigned.

It can be observed from the following table that the reduction in the number of LUTs by the proposed method is substantial as compared to increase in the execution time for the mapping process.

Results of few benchmark circuits for LUTs formation are tabulated.

| Design | No. of LUTs by Proposed Technique | No. of LUTs by LevelMap | No. of LUTs by FlowMap | Execution Time for Proposed Tech. (seconds) | Execution Time for LevelMap (seconds) |
|---|---|---|---|---|---|
| alu2 | 265 | 272 | 421 | 0.46 | 0.4 |
| alu4 | 1646 | 1756 | 2080 | 3.5 | 3.4 |
| apex2 | 2117 | 2274 | 2511 | 4.5 | 4.2 |
| apex3 | 818 | 867 | 1010 | 1.2 | 1.1 |
| duke2 | 263 | 270 | 327 | .42 | 0.4 |
| Misex3 | 2265 | 2393 | 2661 | 6.9 | 6.7 |
| Rd73 | 170 | 184 | 263 | 0.4 | 0.3 |
| Rd84 | 391 | 402 | 481 | 1.6 | 1.5 |
| clma_mod | 7452 | 9344 | 9248 | 47.5 | 46.35 |

-continued

Results of few benchmark circuits for LUTs formation are tabulated.

| Design | No. of LUTs by Proposed Technique | No. of LUTs by LevelMap | No. of LUTs by FlowMap | Execution Time for Proposed Tech. (seconds) | Execution Time for LevelMap (seconds) |
|---|---|---|---|---|---|
| fft16_mod | 15947 | 19334 | 18215 | 78.1 | 77 |
| Cordic | 800 | 1117 | 907 | 2.1 | 1.9 |
| Dalu | 603 | 875 | 824 | 3 | 2.9 |
| Total | 32737 | 39088 | 38948 | 149.68 | 146.15 |

Reductions in LUTs count (w.r.t. LevelMap) is 16.25%
Increase in Execution time is 2%

By exploring the reconvergent paths in conjunction with fan-out replication, the invention maps a design with substantially reduced number of LUTs with minimal increment in execution time. Thus the present invention overcomes the drawbacks of the prior art mapping system.

What is claimed:

1. A system for improved optimal mapping of LUT based FPGAs comprising:
   a Directed Acyclic Graph (DAG) representation of a network to be mapped including a plurality of nodes v,
   a sorter performing a sort on said DAG representation to reduce its complexity,
   a Dependency Definer that determines a dependency variable dv of each node v in the DAG,
   a Reconvergent Path Locator (RPL) that determines from transitive fan-ins of each said node v whether reconvergent paths exist and if so updates the dependency variable dv of that node v to reflect the existence of the reconvergent paths,
   a Priority Determiner (PD) that determines a priority of all child nodes of each node v,
   a Node Sorter (NS) that sorts a list of child nodes in descending order of priority,
   a Mapper (M) that assigns LUT's to the child nodes starting at a beginning of said sorted list until the node dependency variable dv is less than one plus a number of inputs to the LUT,
   an Assignor (A) that assigns an LUT to each output node in the DAG.

2. A system for improved optimal mapping as claimed in claim 1, wherein said sorter is a topological sorter.

3. A system for improved optimal mapping as claimed in claim 1, wherein said Node Sorter is a Child node sorter.

4. A system for improved optimal mapping as claimed in claim 1, wherein said Mapper is a LUT Mapper.

5. A system for improved optimal mapping as claimed in claim 1, wherein said Assignor is a LUT assignor.

6. A method for improving optimal mapping of LUT based FPGA's, the method comprising the steps of:
   generating a Directed Acyclic Graph (DAG) representation of a network to be mapped including a plurality of nodes v,
   sorting the network in the DAG to reduce its complexity,
   determining a dependency variable dv of each node v in the DAG,
   locating from transitive fan-ins of each node v whether reconvergent paths exist and if so updating the dependency variable dv of that node to reflect the existence of the reconvergent paths until the dependency variable exceeds k, wherein k equals a number inputs to the LUT,
   determining a priority of all child nodes of each node,
   sorting the child nodes in the descending order of their priority,
   assigning LUTs to the child nodes until the node dependency variable dv is less than one plus k, and
   assigning an LUT to each output node in the DAG.

7. A method for optimal mapping of LUT based FPGAs as claimed in claim 6, wherein said sorting is topologically sorting the network in the DAG.

8. A method for optimal mapping of LUT based FPGA's as claimed in 6, wherein said dependency variable dv is determined by considering the inputs and outputs of each node.

9. A method for optimal mapping of LUT based FPGA's as claimed in claim 6, wherein a number of said reconvergent paths which are located are selected to be equal to k which is the number of inputs to the LUT.

10. A method for optimal mapping of LUT based FPGA's as claimed in claim 6, wherein said determining the priority is generating the priority for the child nodes based on the fan-outs of the nodes in said DAG.

11. A method for optimal mapping of LUT based FPGA's as claimed in claim 6, wherein said assigning an LUT is forming an LUT for a node after performing a check on the number of fan-outs for said node and the dependency variable dv of the node.

12. A method for optimal mapping of LUT based FPGA's as claimed in claim 11, wherein said forming an LUT is assigning LUTs to all unassigned nodes.

13. A system for optimal mapping of LUT based FPGA's, the system comprising:
   a Directed Acyclic Graph (DAG) representation of a network to be mapped including a plurality of nodes v,
   a sorter performing a sort on said DAG representation to reduce its complexity,
   a Dependency Definer that calculates a dependency variable dv of each node v in the DAG,
   a Reconvergent Path Locator (RPL) that determines from transitive fan-ins of each said node whether k reconvergent paths exist and if so updates the dependency variable dv of that node to reflect the existence of the reconvergent paths until the dependency variable exceeds k, wherein k equals a number of inputs to the LUT,
   a Priority Determiner (PD) that determines a priority of all child nodes of each node v,
   a Node Sorter (NS) that sorts a list of child nodes in descending order of priority,
   a Mapper (M) that assigns LUT's to the child nodes starting at a beginning of said sorted list until the node dependency variable dv is less than one plus k,
   an Assignor (A) that assigns an LUT to each output node in the DAG.

14. A system as claimed in claim 13, wherein said sorter is a topological sorter.

15. A system as claimed in claim 13, wherein said Node Sorter is a Child node sorter.

16. A system as claimed in claim 13, wherein said Mapper is a LUT Mapper.

17. A system as claimed in claim 13, wherein assignor is a LUT assignor.

18. A system as claimed in claim 13 wherein the Mapper (M) assigns LUT's to nodes v in the DAG if its dependency variable dv is >1 and a number of fanouts from that node v is >2.

19. A system as claimed in claim 13 wherein the Mapper (M) assigns LUT's to nodes v in the DAG if a number of fanouts from that node v is >3.

20. A method for improving optimal mapping of look-up table (LUT) based field programmable gate arrays (FPGAs) wherein a network to be mapped is represented by a Directed Acyclic Graph (DAG) including a plurality of nodes v, and wherein each LUT has k inputs, the method comprising:
- sorting the DAG to reduce its complexity;
- computing a dependency variable dv for each node v based on its input(s) and output(s);
- identifying child nodes c from the node v;
- sorting a list of child nodes c in an order of priority;
- assigning a LUT to a node v if at least one of the following conditions is satisfied:
  - if its dv>k;
  - if its dv>1 and a number of fanouts from that node v is >2; and
  - if a number of fanouts from that node v is >3; and assigning a LUT to the child node(s) c of node v until dv>k+1.

21. The method of claim 20 wherein computing a dependency variable dv for each node v based on its input(s) and output(s) comprises:
- determining whether k reconvergent paths exist from transitive fan-ins of the node v; and
- if so, updating the dv of that node v to account for the determined reconvergent paths.

22. The method of claim 20 wherein assigning a LUT to a node v is performed only after the dependency variable dv has been computed for each node v.

23. A method for improving optimal mapping of look-up table (LUT) based field programmable gate arrays (FPGAs) wherein a network to be mapped is represented by a Directed Acyclic Graph (DAG) including a plurality of nodes v, and wherein each LUT has k inputs, the method comprising:
- sorting the DAG to reduce its complexity;
- computing a dependency variable dv for each node v based on its input(s) and output(s);
- identifying nodes whose dependency variable dv is >k;
- assigning to each identified node a LUT if either of the following conditions is satisfied:
  - if its dv>1 and a number of fanouts from that identified node is >2; and
  - if a number of fanouts from that identified node is >3;
- identifying child nodes c from the node v;
- sorting a list of child node(s) in an order of priority; and
- assigning a LUT to the child node(s) c of node v until dv<k+1.

24. The method of claim 23 wherein computing a dependency variable dv for each node v based on its input(s) and output(s) comprises:
- determining whether k reconvergent paths exist from transitive fan-ins of the node v; and
- if so, updating the dv of that node v to account for the determined reconvergent paths.

25. The method of claim 23 wherein assigning a LUT to a node v is performed only after the dependency variable dv has been computed for each node v.

* * * * *

UNITED STATES PATENT AND TRADEMARK OFFICE
CERTIFICATE OF CORRECTION

PATENT NO. : 7,415,681 B2  Page 1 of 1
APPLICATION NO. : 11/025785
DATED : August 19, 2008
INVENTOR(S) : Ajay Tomar et al.

It is certified that error appears in the above-identified patent and that said Letters Patent is hereby corrected as shown below:

On the title page, item (56), under "Other Publications", in column 2, line 5, delete "Table-Bsed" and insert -- Table-Based --, therefor.

In column 7, line 17, in Claim 20, delete "$dv>k+1$." and insert -- $dv<k+1$. --, therefor.

Signed and Sealed this

Seventeenth Day of February, 2009

JOHN DOLL
*Acting Director of the United States Patent and Trademark Office*